United States Patent
Chopra

(10) Patent No.: US 7,587,643 B1
(45) Date of Patent: Sep. 8, 2009

(54) SYSTEM AND METHOD OF INTEGRATED CIRCUIT TESTING

(75) Inventor: Rajesh Chopra, Fremont, CA (US)

(73) Assignee: T-RAM Semiconductor, Inc., Milpitas, CA (US)

( * ) Notice: Subject to any disclaimer, the term of this patent is extended or adjusted under 35 U.S.C. 154(b) by 129 days.

(21) Appl. No.: 11/213,043

(22) Filed: Aug. 25, 2005

(51) Int. Cl.
*G01R 31/28* (2006.01)

(52) U.S. Cl. .................................... 714/726
(58) Field of Classification Search .............. 714/726
See application file for complete search history.

(56) References Cited

U.S. PATENT DOCUMENTS

| | | | |
|---|---|---|---|
| 5,355,369 A | | 10/1994 | Greenberger et al. |
| 6,357,025 B1 | * | 3/2002 | Tuttle .......................... 714/724 |
| 6,598,193 B1 | | 7/2003 | Li et al. |
| 6,807,644 B2 | | 10/2004 | Reis et al. |
| 6,925,583 B1 | | 8/2005 | Khu et al. |
| 7,076,705 B2 | * | 7/2006 | Ohbayashi ................... 714/724 |
| 7,181,663 B2 | * | 2/2007 | Hildebrant .................. 714/726 |

OTHER PUBLICATIONS

Nick Patavalis, A Brief Introduction to the JTAG Boundary Scan interface, Nov. 2001, InAccess Network, http://www.inaccessnetworks.com/ian/projects/ianjtag/jtag-intro.html.
XILINX, Boundary Scan Basics, Mar. 15, 2000, Web Software Doc, http://toolbox.xilinx.com/docsan/3_1i/data/common/jtg/dppa/appa.htm.

* cited by examiner

*Primary Examiner*—James C Kerveros
(74) *Attorney, Agent, or Firm*—Fields IP, PS

(57) ABSTRACT

An integrated circuit may include a packet decoder to receive serial data and to decode JTAG signals from the packets received. A JTAG processor may test the electrical circuitry dependent on the JTAG signals decoded. In a further embodiment, a test system may include a library of selectable JTAG routines. An encoder may encode a signal with serial data representative of sequential JTAG signals for at least one of the selectable JTAG routines. In a method of testing, the integrated circuit may receive the serial data signal at a predetermined terminal. A portion of the serial data may be examined to determine the presence of a predefined signature key. JTAG data may then be parsed from the serial data and tests performed based on the parsed JTAG data.

23 Claims, 4 Drawing Sheets

SYSTEM AND METHOD OF INTEGRATED CIRCUIT TESTING

BACKGROUND

This disclosure is directed to electronic circuits and, more particularly, to methods and systems for interfacing and testing of integrated circuits.

The evolution of integrated circuits has led to electronic devices of ever increasing density and complexity. With these increased levels of integration, artisans within the IC industry have often confronted various compromises associated with manufacturability, test and/or functionality. On one hand, artisans may seek to design devices with a large number of interfacing links to assist more ready integration and functionality within particular system level applications. On the other hand, they may seek to reduce the size of the chip for reduced costs; which may therefore limit the physical real-estate and the number of pin/pads that may be formed for interfacing.

Also factoring into the various design considerations may be the need to assist ease of manufacturing and test. Accordingly, some typical methods of testing have been developed to facilitate testing by way of test vectors; wherein input vectors may be presented to a give portion of the integrated circuit while resulting vectors may be retrieved and analyzed for determining device functionality. For some of these procedures, a given chip may be designed with a plurality of input/output pads or pins dedicated to test. It may be understood, however, that such dedication of pads or pins to test may have an adverse impact the I/O bandwidth or functionality which might otherwise be desired for the integrated circuit.

Some methods of testing of integrated circuits may seek to increase the coverage or scope of testing, which may further contribute to device complexity—as may often be associated with certain flip-chip, chip-scale package and other high-density (e.g., fine pitch ball grid array FPGA) devices. In some cases, the manufactures incorporate circuits within these devices for performing built-in self tests and/or diagnostics. Results of such built-in self tests might then be made available for retrieval via a given number of dedicated test pads/pins.

Further facilitating integrated circuit testing, some within the industry have evolved boundary scan techniques and circuits of known tools available to assist with the routing and recovery of test vectors to/from various portions of an integrated circuit. One such form of boundary scan procedure, known to artisans in the industry as JTAG, may be understood to refer to a standard written by the Joint Test Action Group, and also similarly adopted by the IEEE in *IEEE Standard 1149*, for *IEEE Standard Test Access Port and Boundary-Scan Architecture*, which is incorporated herein by reference. Typically, the JTAG standard may be understood to define, in general, a 4-pin serial data transfer structure for accessing and controlling a standard test interface protocol and/or platform to various nodes of a digital circuit, which may also be know to assist with testing of circuitry within a chip.

To assist ease of manufacturing of the integrated circuits, artisans may strive to sustain avenues into these integrated circuits for supporting test. But despite some of the compelling needs for testing, some may find the interfacing needs for ordinary application of even more importance, especially where the devices may be understood to be designated for integration into higher level systems, as in the case of a given flip-chip device that is to be embedded with various other devices such as processors, buses, and/or network controllers and the like within a larger system. It may be understood, therefore, that some of these enhanced levels of integration may place a further premium on the limited number of pins/pads that may be available for interfacing such electrical devices.

SUMMARY

In an embodiment of the present invention, an integrated circuit such as a semiconductor memory device may include a packet decoder operable to receive a serial data signal and to decode JTAG signals from packets within the serial data signals. A JTAG processor may receive the JTAG signals decoded and perform tests on electrical circuitry within the integrated circuit dependent upon the JTAG signals. In a further embodiment, a multiplexer may select from one of at least two different sources from which to obtain the JTAG signals for driving the JTAG processor. One of the two different sources may comprise the output of the decoded JTAG signals from the decoder. The other source may comprise an external port of the integrated circuit dedicated to interfacing JTAG signals directly from/to an external JTAG system.

In a further embodiment, a signature key decoder may determine the presence of a predefined signature key within a given sequence of the serial data received. Upon determining the presence of the predefined signature key, the signature key decoder may further enable operation of the decoder for parsing JTAG signals from the serial data.

In another further embodiment, an output multiplexer may be selectively operable dependent upon an enable signal from the JTAG process controller for multiplexing test data output to a data terminal of the integrated circuit.

BRIEF DESCRIPTION OF THE DRAWINGS

Subject matter of embodiments of the present invention may be understood by reading the following description with reference to the accompanying drawings, in which.

DETAILED DESCRIPTION

Figure 1:
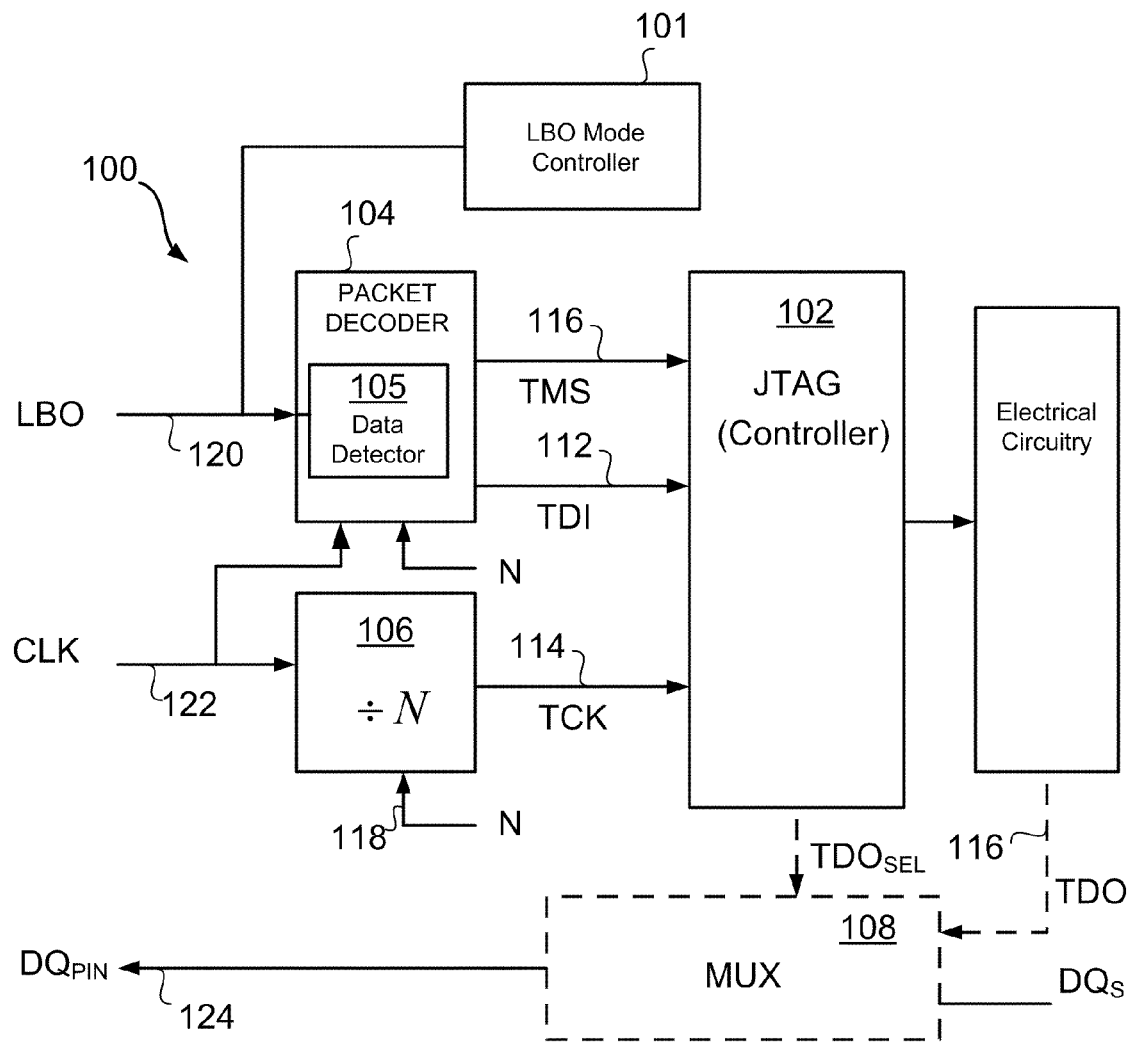
FIG. 1 is a simplified schematic diagram of an integrated circuit, in accordance with an embodiment, showing a keyed interface to an internal JTAG Test Access Port.

In the description that follows, readily established circuits and procedures for the exemplary embodiments may be disclosed in simplified form (e.g., simplified block diagrams and/or simplified description) to avoid obscuring an understanding of the embodiments with excess detail and where persons of ordinary skill in this art can readily understand their structure and operation by way of the drawings and disclosure. For the same reason, identical components may be given the same reference numerals, regardless of whether they are shown in different embodiments of the invention.

As referenced herein, portions of, e.g., a circuit may be described as being formed in, at or on an electrical device. Such alternative terms in/at/on may be used individually merely for purposes of convenience. In the context of forming semiconductor devices, such terms may collectively reference portions of a semiconductor chip that may be within and/or on other starting material.

In accordance with an embodiment of the present invention, referencing FIG. 1, an integrated circuit such as a semiconductor memory device (for example, SRAM) may comprise a plurality of terminals or pins. Some of these pins 120, 122, 124 may normally be dedicated for signals associated with normal device operation, such as linear burst order control (LBO), system clock (CLK), and data ($DQ_S$) type signals respectively. One of the terminals (LBO) 120 may be understood to be dedicated to static operative purposes during normal operation of integrated circuit 100. For example, the linear burst order (LBO) control input 120 may generally receive a static signal of either high or low for selecting a particular operative mode 101 (for example, via controller for linear or burst bus transfer) for the integrated circuit.

Continuing with a particular embodiment with further reference to FIG. 1, packet decoder 104 may be selectively invoked for enabling multiplexed access to an internal test access port (TAP) within the integrated circuit 100. Once invoked or enabled, decoder 104 may decode JTAG signals from a received serial data signal. These JTAG signals, in turn, may be forwarded to a JTAG controller to operate or drive test circuitry within the device in accordance with known JTAG standards and procedures.

Clock pin or terminal 122 may receive a system clock (CLK). This clock may synchronize the recovery of serial data from the serial data signal as performed, e.g., by decoder 104. Divider 106 may also receive the system clock and divide a frequency of the system clock for generating a test clock (TCK) to be propagated on an internal test clock line 114 for the JTAG module(s). This test clock may be used to sequence JTAG procedures within the JTAG controller as determined by the recovered JTAG signals, TMS and TDI.

Figure 2:
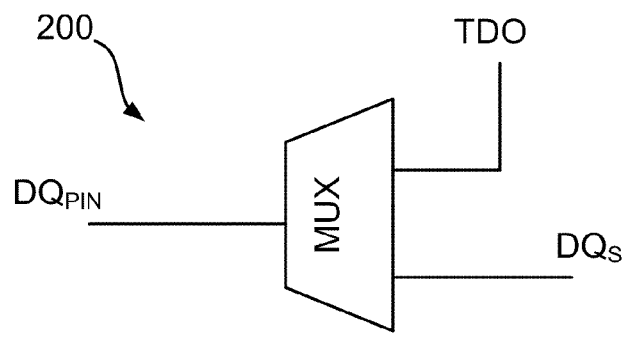
FIG. 2 a schematic diagram of a multiplexer for an embodiment of the present invention operable to multiplex test data output onto an external data terminal of an integrated circuit.

In a further optional aspect of this embodiment, further referencing FIG. 1, test results may be retrieved from the internal test access port by way of a terminal of the integrated circuit 100 that might otherwise be dedicated normally for bus transfers. For example, multiplexer 108 may be enabled selectively by JTAG controller 102 for multiplexing and enabling transfer of test data output (TDO) to terminal or pin 124 of the integrated circuit. Referencing FIG. 2, multiplexer 200 may comprise two different selectable ports. The multiplexer may selectively couple the device's data terminal $DQ_{pin}$ to one of the two ports. One selectable port may receive test data output (TDO) of the JTAG test access port. The other selectable port of multiplexer may be associated with the internal data bus ($DQ_S$) of the integrated circuit. An enable input to the multiplexer (not shown) may then be driven by the JTAG controller for selecting which of the two different sources to couple to the integrated circuit's data terminal. For example, an internal state machine within the JTAG controller may advance to a particular stage of a test procedure, which may enable the multiplexer to selectively couple the JTAG output port to pin 124 of the integrated circuit.

Figure 4:
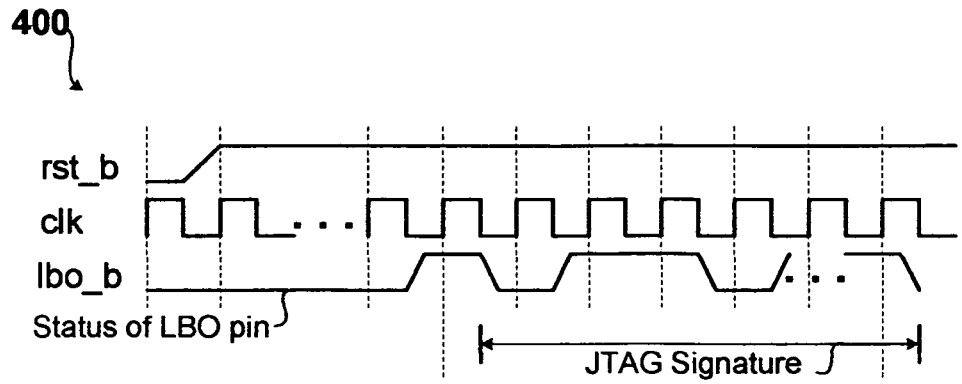
FIG. 4 is a simplified timing diagram showing a sequence of data in a serial data stream to a signature key, to assist an understanding of embodiments of the present invention, and showing decode in synchronous relationship with respect to a system clock.

In operation, to invoke such a sneaky or multiplexed access to the JTAG test access port, in accordance with an embodiment of the present invention, referencing FIGS. 1 and 4, a signature key may be sent to decoder 104 following transition of reset signal rst_b. The signature key may comprise a sequence of serial data bits of a predetermined value, which may be encoded as a header to the serial data signal as illustrated in the timing diagram 400 of FIG. 4. The serial data signal may be sent to the linear burst order (LBO) control input 120 of integrated circuit 100. Additionally, a system clock (CLK) may be applied to the clock input 122 of integrated circuit 100.

Decoder 104 may comprise data detector 105 to detect, in synchronous relationship to the system clock, a sequence of data bits from the serial data input signal. A comparator may determine whether a given portion of the sequence may correspond to a predetermined signature key. For example, the signature key may be previously programmed within the integrated circuit during fabrication, whereupon only particular users with knowledge of the signature key may be able to access and exercise the internal test access port.

In some embodiments, the signature key may be as long as 32 bits so as to ensure security of access to the internal test access port. In alternative embodiments, the number of bits associated with the signature key could be greater or less dependent upon a degree of security desired. In other words, the signature key might be more complex so as to reduce a possibility of inadvertent invocation of the keyed access to the internal JTAG test access port.

Figure 5:
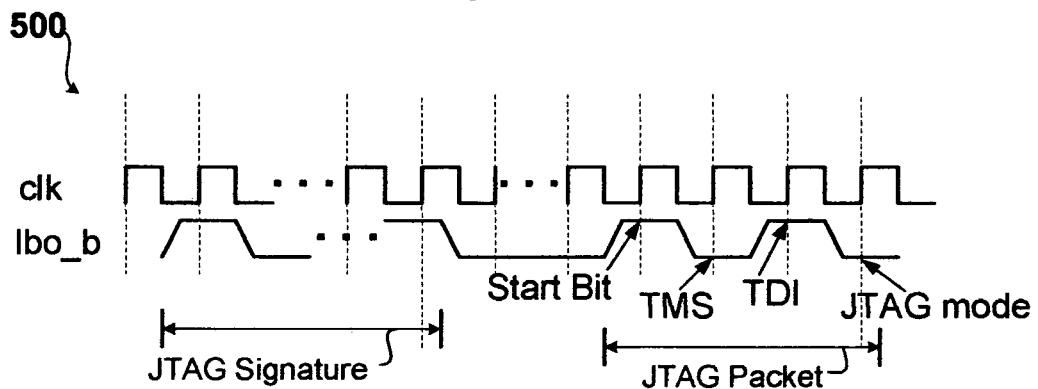
FIG. 5 is a simplified timing diagram useful for further describing embodiments of the present invention, and showing additional data in a JTAG packet following the signature key.

Once a comparator within decoder 104 should recognize a valid JTAG signature key, decoder 104 may proceed with parsing data bits form JTAG packets as shown by the timing diagram 500 of FIG. 5. For example, the decoder may monitor the serial data signal at LBO input 120 for determining the next transition of the serial data signal following the signature key. It may be understood that the detection of data bits from the input signal may be made synchronous to transitions of the system clock (CLK). The first change in the input signal at the LBO pin (lbo_b) following recognition of the JTAG signature key may serve to define the start bit for signaling the start of a JTAG packet. The next active clock transition may be used to capture data for a test mode select bit (TMS) within a JTAG packet. The following active clock transition may trigger synchronous detection of data for a test data input bit (TDI) from the JTAG packet. The final bit of the JTAG packet may be used to define a JTAG-mode-continuity bit.

In summary, when the JTAG signature is recognized, decoder 104 may begin to decode JTAG packets for parsing and recovering JTAG signals. The end bit of a given JTAG packet, i.e., the JTAG-mode-continuity bit, specifies whether or not to continue sustained enablement of the sneaky multiplexed access to the internal JTAG test access port for further parsing of JTAG packets. For example, a low state on the JTAG-continuity-mode bit may be used to indicate that additional JTAG packets should follow, and that these packets may be recovered sequentially without having to scan in another signature key. A high level at the JTAG continuity mode select bit may, alternatively, be used to terminate the sneaky multiplexed access to the internal JTAG test access port (TAP).

Figure 6:
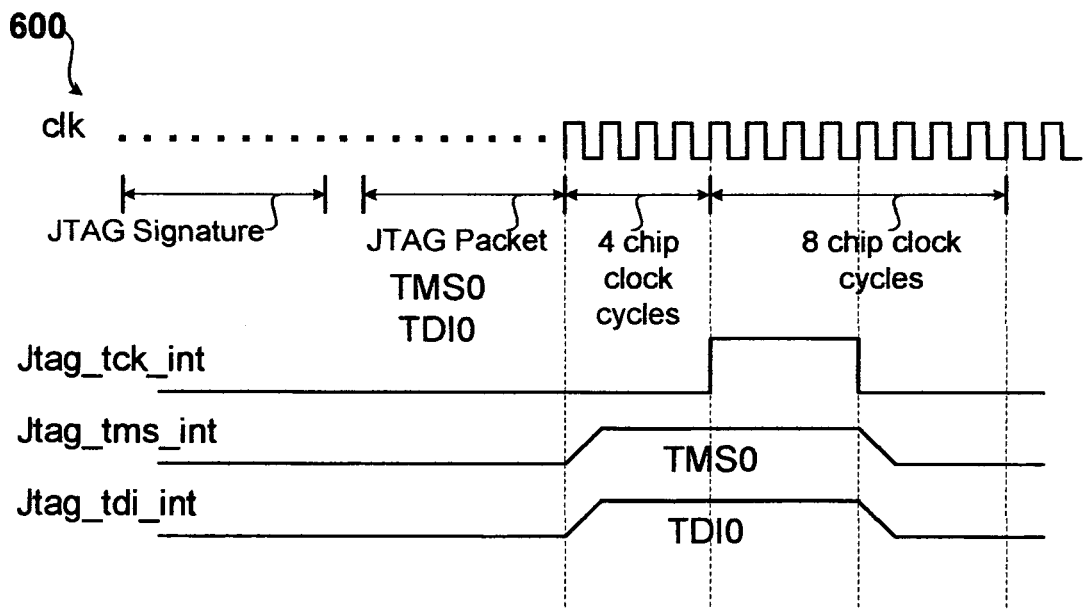
FIG. 6 is a simplified timing diagram useful for further describing embodiments of the present invention, and showing recovered JTAG signals that may be supplied to an internal test access port of an integrated circuit.

Moving forward with further reference to FIG. 6, the JTAG signals of TMS and TDI may be parsed from the serial data detected. These JTAG signals, when determined, may then be forwarded to JTAG controller 102 (FIG. 1). With the JTAG data signals presented at their respective inputs 112, 116 of the JTAG controller, a recovered JTAG clock (TCK) may be applied to the test clock input 114 of JTAG controller 102 for latching the JTAG data and sequencing a given cycle of a test procedure within the JTAG controller. In this particular embodiment, divider 106 may be previously programmed with a division ratio N such as 8. For example, during the test or burn-in of the integrated circuit, a system clock may comprise a frequency of 10 MHz. The divider may thus divide the system clock by 8 to generate an internal test clock frequency of 1.25 MHz.

Further referencing the timing diagram 600 of FIG. 6, a transition of the test clock (jtag_tck_int) may clock the JTAG signals TMS and TDI recovered from the first packet into JTAG controller 102. The test clock may further advance a particular cycle of the JTAG state machine sequence. During this cycle of JTAG operation, it may be understood that decoding of the next packet may be performed for obtaining JTAG signals that may be used for a second cycle. Such JTAG signal recoveries and clocking of JTAG cycles may continue for a number of iterations as known for implementing various JTAG procedures of known JTAG standards. Such JTAG procedure may include, for example, transferring data through a boundary scan chain, applying test vectors to a portion of electrical circuitry within the integrated circuit, or assisting burn in of the integrated circuit.

Responsive to some of the JTAG procedures that may be executed by JTAG controller 102, output results or test data output (TDO) may be transferred for recovery by an external system. Accordingly, the JTAG controller may be further operable in a particular stage of a JTAG procedure for enabling an output multiplexer that may multiplex the TDO output to a DQ pin of the integrated circuit.

Figure 3:
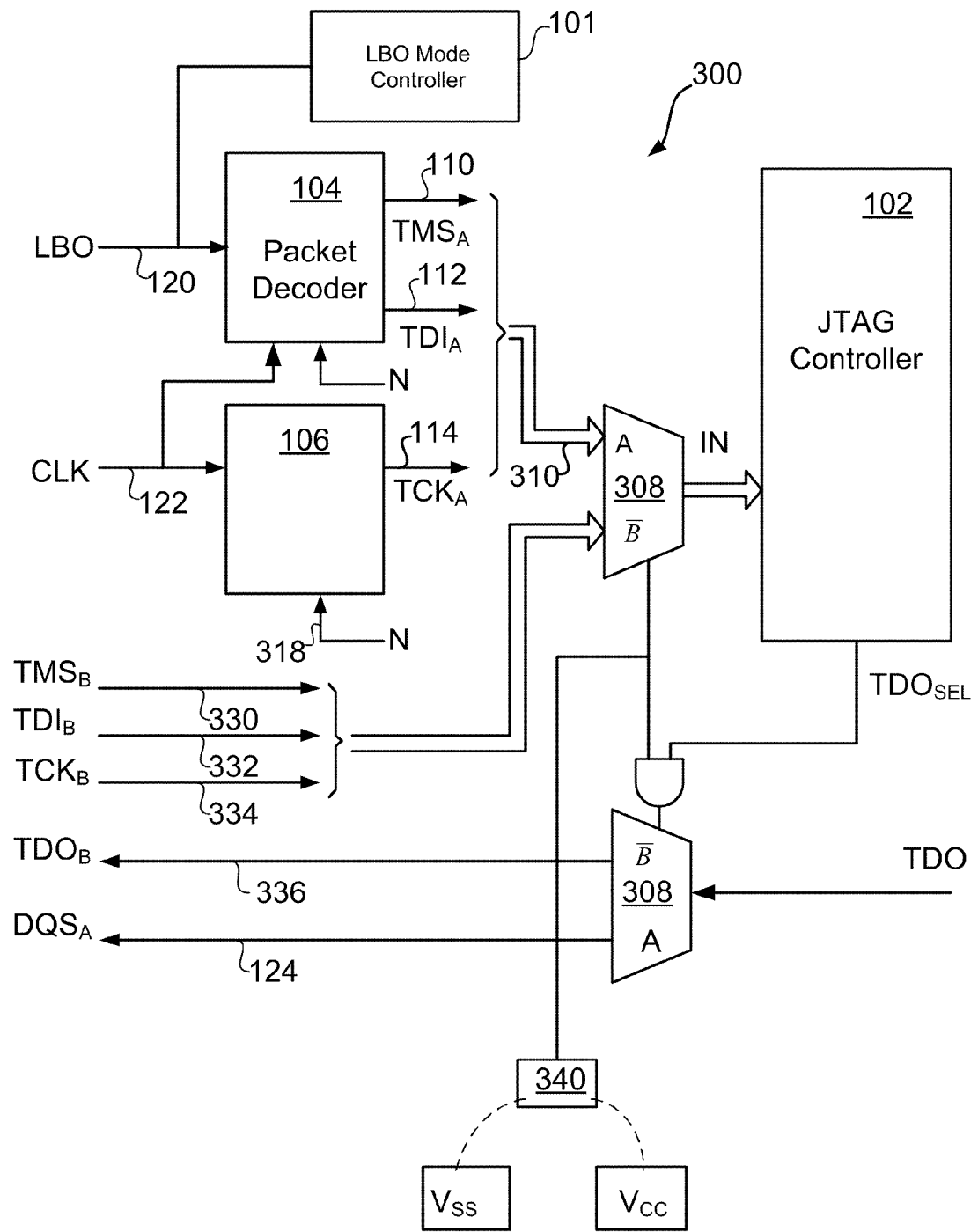
FIG. 3 is a schematic diagram of an integrated circuit, such as a semiconductor memory device, in accordance with an embodiment of the present invention, showing circuitry for enabling alternative configuration modes.

In accordance with a further embodiment of the present invention, referencing FIG. 3, an integrated circuit or chip 300 may include further circuitry to enable chip programming or package assembly for one of two different avenues to a Test Access Port. One configuration mode may incorporate the previsions for signature-keyed/multiplexed access to the internal test access port; whereas, an optional configuration mode may by-pass the keyed/multiplexed avenue to the TAP.

For example, further referencing FIG. 3, configuration pad 340 (e.g., a wirebond pad or terminal) of chip 300 may be tied to one of two different levels, for example, $V_{SS}$ or $V_{CC}$. One bound-out for the chip may be used when the chip is to be packaged with I/O pins, such as pins 330, 332, 334, 336, that may be available and dedicated to JTAG signals. Alternatively, the other bound-out may be used when the chip is to be assembled into a device of more limited I/O resources. In this later alternative selection, the JTAG interface may be multiplexed by way of pins/terminals of the chip, such as terminals 120, 122, 124, as might otherwise be associated with, for example, Linear Burst Order control (LBO), a system clock (CLK), and data I/O ($DQS_A$).

In a specific example, further referencing FIG. 3, when the chip configuration pad 340 is tied low, multiplexer 308 may select B-channels for coupling the dedicated JTAG terminals 330, 332, 334 to the JTAG controller. Multiplexer 308' may similarly be configured for coupling the TDO portion of the JTAG internal test access port to the dedicated TDO output pin 336 of the packaged component. Alternatively, when the chip configuration pad 340 is tied to an upper level (such as $V_{CC}$), multiplexer 308 may select A-channels for obtaining the JTAG source signals $TMS_A$, $TDI_A$, $TCK_A$ of the alternative keyed/multiplexed interface established by decoder 104 and divider 106. Likewise, multiplexer 308' may be operable to selectively couple the TDO output of the JTAG test access port to data terminal $DQ_A$ dependent upon the TDO enable signal provided by JTAG controller 102. In some embodiments, configuration pad 340 may comprise a pad to be wirebounded to $V_{SS}$ or $V_{CC}$. It may be understood, however, that alternative embodiments may incorporate other known pullup/pull-down option means, such as pull-up/pull-down transistors, fuses or anti-use provisions, or programmable configuration registers.

Figure 7:
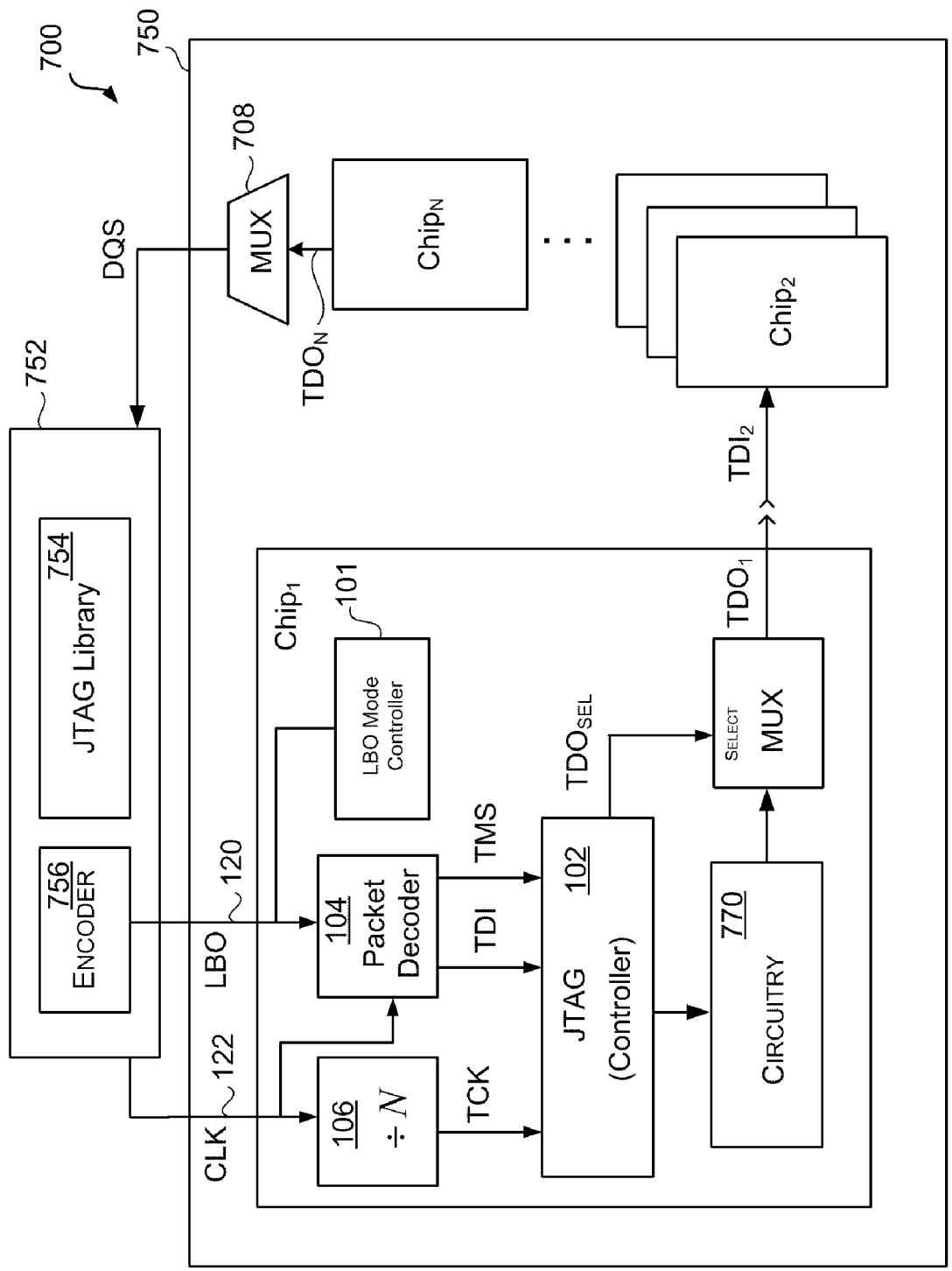
FIG. 7 is a simplified block diagram for a test system in accordance with an embodiment of the present invention, showing a plurality of chips to an electrical device incorporating a keyed and/or multiplexed interface/access to an internal test access port to at least one of the chips.

In accordance with further embodiments of the present invention, referencing FIG. 7, a system 700 may include a tester 752 for testing electrical device 750 by way of known JTAG procedures of a JTAG library 754. An encoder of the tester 752 may encode a serial data signal with header information comprising a JTAG signature and packets encoded with JTAG signals as presented hereinbefore relative to FIGS. 4-6. The header information may include a JTAG signature key specific to $Chip_1$ by which to selectively invoke a sneaky multiplexed JTAG access to an internal test access port of the chip. The encoder may encode a sequence of the JTAG packets with the respective TMS, TDI data information specific to particular JTAG modules as may be selected from JTAG library 754. Accordingly, the tester 752 may test electrical circuitry 770 of $Chip_1$ by way of known JTAG standards via multiplexed JTAG interface embodiments as described hereinbefore relative to FIGS. 3 and 1.

Further referencing FIG. 7, the test data output of $Chip_1$ ($TDO_1$) may then be coupled to the test input of $Chip_2$ as known for facilitating serial boundary scan processes to other chips or modules of electrical device 750. The final chip, $Chip_N$, of electrical device 750 may then drive a multiplexer by which to send test data output (TDO) onto a data pin (DQ) for retrieval by tester 752. In some embodiments, the electrical device 750 may be referenced as a "system on a chip," which may have a plurality of chips or modules to an overall packaged solution.

It may be understood that various other embodiments may be apparent to those skilled in the art as taken from the above description. The scope of the invention, therefore, should be determined with reference to the claims along with the full scope of equivalence to which these claims are entitled.

What is claimed is:

1. An integrated circuit comprising:

electrical circuitry;

a plurality of pins/pads to interface at least a portion of the electrical circuitry;

a first pin/pad of the plurality to receive a static signal for selecting a particular operative mode during a normal operation of the integrated circuit, and a serial data signal for assisting test during a sneaky JTAG test access operation of the integrated circuit;

a packet decoder configured to receive serial data of the serial data signal received from the first pin/pad during the IC operability for the sneaky JTAG test access and decode JTAG (Joint Test Action Group) signals from packets of the serial data when received;

a JTAG processor to act on at least a portion of the electrical circuitry dependent on the JTAG signals decoded; and a mode select controller configured to receive from the first pin/pad the static signal for selecting the particular operative mode for the integrated circuit when under the normal operation, the selecting is based on the level of the static signal received and further dependent on absence of the sneaky JTAG test access operation.

2. The IC of claim 1, further comprising:
a second pin/pad of the plurality to receive a clock signal; and
a clock recovery circuit to receive an external clock signal from the second pin/pad and recover a JTAG clock to sequence the JTAG processor when the IC is under the sneaky JTAG test access operation.

3. The IC of claim 1, further comprising:
a JTAG port defined by dedicated JTAG pins/pads from amongst the plurality of pins/pads; and
a multiplexer to select one of at least two different sources by which to obtain JTAG signals for driving the JTAG processor; wherein the at least two different sources for the JTAG signals comprise (i) the decoder associated with the decoded JTAG signals, and (ii) the JTAG port of the dedicated JTAG pins/pads associated with JTAG signals more direct from an external source.

4. The IC of claim 3, further comprising:
a serial key decoder to receive the serial data signal from the first pin/pad and determine presence of a predefined signature key within a given sequence of the serial data received;
wherein the packet decoder is selectably operable dependent on the determinations of the serial key decoder.

5. The IC of claim 4, in which the serial key decoder further comprises a data detector coupled to the first pin/pad to detect data from the serial data signal when received at the first pin/pad in synchronous relationship to transitions of an external clock.

6. The IC of claim 5, further comprising a divider to divide the external clock and generate a JTAG clock.

7. The IC of claim 6, in which the divider is programmable with a divisor determined by a configuration controller.

8. The IC of claim 5, in which the packet decoder is further configured to determine and decode multiple JTAG packets of a given sequence in the serial data received subsequent a given signature key determination.

9. The IC of claim 8, further comprising a buffer/register/pipeline configured to buffer JTAG signals when decoded by the packet decoder and to present them to the JTAG processor as sequenced by the recovered JTAG clock.

10. The IC of claim 9, in which the buffer register is configured to pipeline multiple JTAG signals of sequentially decoded packets of the serial data when received for presentment to the JTAG processor.

11. The IC of claim 3, further comprising:
a data output terminal of the plurality of pins/pads; and
an output multiplexer selectively operable to multiplex output test data (TDO) from the JTAG processor onto the data output terminal.

12. The IC of claim 11, further comprising an internal data line, wherein the output multiplexer is selectively operable to electrically couple the output terminal to one of either the output of the JTAG processor or the internal data line.

13. A method of testing an integrated circuit, comprising:
receiving a serial data signal at a control terminal of an integrated circuit;
detecting serial data from the serial data signal received at the control terminal;
comparing a portion of the serial data detected to a predefined signature key;
dependent on a determination of the comparing, parsing JTAG (Joint Test Action Group) data from the serial data as further detected by the detecting; and
testing circuitry of the integrated circuit based on the parsed JTAG data.

14. The method of claim 13, wherein the serial data signal is received at a configuration mode select pin/pad for said control terminal of the integrated circuit.

15. The method of claim 13, further comprising using a linear burst order (LBO) control terminal of the integrated circuit as said control terminal through which to transfer the serial data signal.

16. The method of claim 15, further comprising:
receiving a system clock within the integrated circuit;
synchronizing the detection of the serial data from the serial data signal relative to the system clock received; and
sequencing at least one of the parsing of the JTAG data and the testing of the circuitry in a synchronous relationship relative to the system clock.

17. The method of claim 16, further comprising:
dividing the system clock received within the integrated circuit and generating a JTAG clock; and
using at least one of a rising and falling transition of the JTAG clock for synchronizing the parsing of the JTAG data from the serial data detected.

18. The method of claim 17, further comprising using the JTAG clock to sequentially transfer the JTAG data to a Test Access Port (TAP) within the integrated circuit and to clock a controller for executing the testing of the circuitry as determined by the JTAG data.

19. The method of claim 16, further comprising:
recovering a divisor from at least one of the serial data signal and the system clock;
programming a divider with the divisor recovered; and
using the programmed divider to perform the dividing.

20. The method of claim 19, in which the recovering of the divisor comprises:
determining a number of cycles of the system clock over a given epoch of the serial data detected; and
defining said divisor based on said cycles determined within the given epoch.

21. The method of claim 16, in which the parsing the JTAG data comprising:
determining a TMS data bit from the serial data;
determining a TDI data bit from the serial data;
determining a JTAG-continuity-mode data bit subsequent the TMS and the TDI determinations; and
repeating the determinations for subsequent TMS, TDI and JTAG-continuity-mode data bits dependent on the determination of the JTAG continuity-mode data bit.

22. The method of claim 21, further comprising selectively driving an internal Test Access Port (TAP) of the integrated circuit with the parsed JTAG signals responsive to determining the presence of the predefined signature key and the determined JTAG-continuity-mode data bit.

23. The method of claim 22, further comprising selectively multiplexing Output Test Data (TDO) onto a DQ terminal of the integrated circuit responsive to predefined JTAG signal processing by a JTAG controller dependent on the determined JTAG-continuity-mode data bit.

* * * * *